(12) United States Patent
MacNamara et al.

(10) Patent No.: US 6,841,848 B2
(45) Date of Patent: Jan. 11, 2005

(54) COMPOSITE SEMICONDUCTOR WAFER AND A METHOD FOR FORMING THE COMPOSITE SEMICONDUCTOR WAFER

(75) Inventors: Cormac John MacNamara, Belfast (GB); William Andrew Nevin, Portadown (GB); Graeme Peters, County Down (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/456,177

(22) Filed: Jun. 6, 2003

(65) Prior Publication Data

US 2004/0245605 A1 Dec. 9, 2004

(51) Int. Cl.[7] .............................................. H01L 29/06
(52) U.S. Cl. ...................... 257/618; 257/347; 257/622; 438/455
(58) Field of Search ................................ 257/642, 643, 257/792, 49, 288, 347, 618, 622; 438/615, 455, 612, 613

(56) References Cited

U.S. PATENT DOCUMENTS

| | | | | |
|---|---|---|---|---|
| 5,340,435 A | * | 8/1994 | Ito et al. ...................... | 438/459 |
| 5,373,184 A | * | 12/1994 | Moslehi ...................... | 257/499 |
| 6,008,113 A | * | 12/1999 | Ismail et al. ................. | 438/615 |
| 6,189,159 B1 | * | 2/2001 | Bailey et al. .................. | 4/235 |

* cited by examiner

Primary Examiner—Roy Potter
(74) Attorney, Agent, or Firm—Gauthier & Connors LLP

(57) ABSTRACT

A composite SOI semiconductor wafer (1) comprises a device layer (2) and a handle layer (3) with a buried oxide layer (4) located between the device and handle layers (2,3). The device and handle layers (2,3) are formed from device and handle wafers (9,10), respectively. A peripheral ridge (14) extending around a first major surface (12) of the device wafer (9) adjacent the peripheral edge (16) thereof is removed by etching a peripheral recess (25) to a depth (d) into the device wafer (9) prior to bonding the device and handle wafers (9,10), in order to avoid an unbonded peripheral pardon extending around the composite wafer (1). The depth to which the peripheral recess (25) is etched is greater then the final finished thickness t of the device layer (2). An oxide layer (22) is grown on the device water (9) and a photoresist layer (23) on the oxide layer (22) is patterned to define the peripheral recess (25). The oxide layer (22) is etched leaving only a portion of the oxide layer (22) beneath the photoresist layer (23), which subsequently forms the oxide layer (4). The peripheral recess (25) is then etched, and the photoresist layer (23) is removed. The oxide layer (22) is fusion bonded to a first major surface (18) of the handle wafer (10) by a high temperature bond anneal. Thereafter the device layer (2) is machined to its final finished thickness t.

37 Claims, 4 Drawing Sheets

COMPOSITE SEMICONDUCTOR WAFER AND A METHOD FOR FORMING THE COMPOSITE SEMICONDUCTOR WAFER

FIELD OF THE INVENTION

The present invention relates to a method for forming a composite semiconductor wafer, and the invention also relates to a composite semiconductor wafer formed by the method.

BACKGROUND TO THE INVENTION

In the fabrication of micro-mechanical components and electronic semiconductor devices in semiconductor wafers, a composite semiconductor wafer is formed. The composite wafer comprises a device layer in which the micro-mechanical components and/or the electronic semiconductor devices are to be formed and which is provided by a device layer forming wafer of semiconductor material, typically, silicon. The device layer is supported on a handle layer, which is formed by a separate handle layer forming wafer, also of semiconductor material, and typically, silicon. In general, the handle layer is a relatively thick layer formed from a wafer of thickness of 350 $\mu$m or greater, while the device layer is a relatively thin layer, and may be of thickness as thin as 1 $\mu$m, and in general, is seldom of thickness greater than 200 $\mu$m. More typically, the device layer is of thickness in the range of 3 $\mu$m to 50 $\mu$m. In general, the device layer is formed from a wafer of thickness of at least 350 $\mu$m, and more commonly of thickness of 500 $\mu$m, which is subsequently machined to the desired thickness in the range of 3 $\mu$m to 50 $\mu$m after formation of the composite wafer.

A buried layer, typically an oxide layer, in general, is located between the device layer and the handle layer. The oxide layer may be thermally grown or deposited, and may be formed on one or both of the device and handle layer forming wafers prior to bonding thereof. Where the oxide layer is formed on the handle layer forming wafer only, the device layer forming wafer is bonded to the oxide layer, and vice versa where the oxide layer is formed an the device layer forming wafer. Where the oxide layer is formed on both the handle and device layer forming wafers, the two oxide layers are bonded together. Bonding of the handle or device layer forming wafers to the oxide layer, or bonding of the two oxide layers together is typically carried out by high temperature fusion bonding in a high temperature anneal bonding process.

Silicon wafers, in general, are produced with one polished major surface, which comprises a peripheral ridge extending from the polished major surface. The ridge which results from the polishing process extends around the wafer adjacent the peripheral edge thereof. This peripheral ridge on the major surface of the device layer forming wafer, which when the composite wafer is formed faces the handle layer, in general, inhibits satisfactory bonding of the wafers around the peripheral edges thereof. This problem arises irrespective of whether a buried oxide layer or other buried layer is located between the two wafers or not. In general, adequate bonding is achieved between the wafers, or between the water and the buried layer, or between the burled layers, as the case may be, over the central area of the wafer and most of the areas of the major surface of the wafer towards the peripheral edge thereof. However, an annular band extends around the major surfaces of the wafers towards the peripheral edge thereof where bonding between the major surface of the wafer and the adjacent oxide layer or wafer is unsatisfactory. If the unbonded peripheral portion is left an the composite wafer, when the device layer forming wafer is machined to the appropriate thickness to form the device layer, the unbonded peripheral portion of the device layer tends to shatter and break off during transportation or subsequent processing, thus causing particle contamination of the wafer surface, the manufacturing line and other problems. Additionally, shattering of the device layer forming wafer adjacent the unbonded peripheral portion may also occur during mechanical polishing of the device layer forming wafer after the device layer forming wafer has been machined to the desired final thickness. Shattering of the unbonded peripheral portion of the device layer forming wafer during polishing leads to scratching of the polishing surface, which is undesirable.

In order to remove the unbonded peripheral portion of the device layer, a process which is commonly referred to as edge definition is carried out. This is carried out after the bonding of the two wafer together, or the bonding of the two wafer with the oxide layer located between the wafers. There are three commonly used methods for carrying out edge definition. One of the methods is a grinding method and the other two methods are commonly referred to as masking methods. In the grinding method the unbonded periphery of the device layer forming wafer is ground off using a suitable grinder. In one of the masking methods the unbonded periphery of the device layer forming wafer is etched. The etching of the unbonded periphery of the device layer forming wafer may be carried out before or after the device layer forming wafer has been machined to the desired finished thickness, and is carried out by appropriately masking and patterning the exposed major surface of the device layer forming wafer, and etching through the entire thickness of the device layer forming wafer. The etching is carried out by a wet silicon etch, such as, for example, a dilute hydrofluoric acid/nitric acid aqueous solution or a potassium hydroxide aqueous solution etch. The other masking method for carrying out edge definition is somewhat similar to the latter method, but requires dry etching of the unbonded periphery of the device layer forming wafer. In this method the exposed major surface of the device layer forming wafer is masked with a patterned photoresist layer, or a patterned photoresist layer with an oxide layer. The device layer forming wafer is then etched through its entire thickness to remove the unbonded periphery by a dry etch, such as an inductively coupled plasma etch (ICP etch) using sulphur hexafluoride as the etchant.

In general, these methods for removing the unbonded periphery of the device layer forming wafer are unsatisfactory, and suffer from a number of problems. Firstly, the grinding method whereby the unbonded periphery of the device layer forming wafer is ground from the composite wafer, depending on the grinding machine used, is often only suitable for semiconductor wafers where the total thickness of the handle and the device layer forming wafers prior to grinding to the thickness of the amount of material removed during grinding is more than two to one. Otherwise, the downward pressure on the composite wafer caused by the action of the grinding wheel of the grinder on the device layer forming wafer is sufficient to shatter the handle layer forming wafer adjacent the peripheral edge thereof. This, thus, prevents the use of this method for composite wafers having a relatively thick device layer and a relatively thin handle layer combination, in other words, a relatively thick silicon on oxide layer SOI and a handle layer which is relatively thin. Additionally, in this grinding method a subsequent chemical etch is required in order to remove crystal damage caused to the surface of the handle layer forming wafer around the peripheral edge of the composite wafer by the grinding, and the chemical etch attacks both the buried oxide layer and the back surface of the handle layer forming wafer, which is undesirable.

The masking methods require relatively expensive equipment for patterning the exposed major surface of the device layer forming wafer. Where the etch is a wet etch, the masking method causes under-etching of the buried oxide layer in composite wafers which comprise a buried oxide layer between the device and handle layer forming wafers. In composite wafers without a buried oxide layer where the device and handle layer forming wafers are bonded with a silicon/silicon bonded interface, the wet or dry etch causes a step to be formed in the handle layer around the peripheral edge thereof adjacent the silicon/silicon bonded interface. The step is formed in the handle layer due to the fact that the edge area of the composite wafer adjacent the bond interface is uneven, and cannot be masked, thereby leaving the edge area exposed to the etchant, which etches the step in the handle layer. In addition, the back surface of the handle layer must also be masked in order to prevent etching thereof by the etching solution.

The use of a dry etch with the masking method is unsuitable for relatively deep device layer forming wafers, due to attack by the etching gas on the underside and edges on the handle layer forming wafer. In addition, pinholes which may occur in the photoresist layer and/or a chemical vapour deposited masking layer result in pinholes being etched in the device layer forming wafer by the etching gas which penetrates through the pinholes in the photoresist and/or chemical vapour deposited masking layer. Indeed, the use of a dry etch with the masking method also causes a step to be formed in the handle layer forming wafer around the peripheral edge thereof adjacent the silicon/silicon bonded interface in composite wafers without a buried oxide layer.

There is therefore a need for a method for forming a composite semiconductor wafer which overcomes the problems of prior art methods.

The present invention is directed towards providing a method for forming a composite semiconductor wafer which overcomes the problems of prior art methods, and the invention is also directed towards providing a composite semiconductor wafer.

SUMMARY OF THE INVENTION

According to the invention there is provided a method for forming a composite semiconductor wafer in the form of a laminate from first and second waters of semiconductor material, the method comprising the step of forming a peripheral recess in a first major surface of the first wafer adjacent a peripheral edge thereof corresponding to respective peripheral areas of the first major surfaces of the first and second wafers where a surface imperfection may occur so that the surface imperfection does not interfere with the formation of the laminate of the first and second wafers with the first major surfaces of the respective first and second wafers facing in directions towards each other.

Preferably, the peripheral recess is formed into the first wafer to a depth from the first major surface which is at least equal to the thickness to which the first wafer is to be subsequently finished or the laminate of the first and second wafers has been formed so that at least a portion of the periphery of the finished first wafer is defined by the peripheral recess. Advantageously, the peripheral recess is formed into the first wafer to a depth from the first major surface which is greater than the thickness to which the first wafer is to be subsequently finished after the formation of the laminate of the first and second wafers.

In one embodiment of the invention at least one layer of material is formed on the first major surface of at least one of the first and second wafers to form a buried layer between the first major surfaces of the first and second wafers when the laminate of the first and second wafers has been formed.

In another embodiment of the invention each layer which is to form the buried layer is an oxide layer.

In one embodiment of the invention each layer which is to form the buried layer is a grown layer. Alternatively, each layer which is to form the buried layer is a deposited layer.

In one embodiment of the invention the layer which is to form the buried layer is formed on the first water, and/or the layer which is to form the buried layer is formed on the second wafer.

In another embodiment of the invention the layer which is to form the buried layer is formed on the first wafer subsequent to the formation of the peripheral recess. Alternatively, the layer which is to form the buried layer is formed on the first wafer prior to the formation of the peripheral recess, and the peripheral recess is formed through the said layer.

Preferably, the peripheral recess is formed by etching the first wafer through the first major surface thereof. In one embodiment of the invention the peripheral recess is formed by wet etching. Alternatively or additionally, the peripheral recess is formed by dry etching.

In one embodiment of the invention the peripheral recess is etched through a patterned layer formed on the first major surface defining the peripheral recess.

Alternatively, the peripheral recess is formed by machining.

In one embodiment of the invention the surface imperfection is on the first major surface of the first wafer.

In another embodiment of the invention the surface imperfection comprises a ridge extending from and around the first major surface adjacent the peripheral edge thereof.

In a further embodiment of the invention the first major surface of the first wafer is a polished surface, and the surface imperfection results from the polishing process.

In another embodiment of the invention the first major surface of the second wafer is a polished surface, and the surface imperfection results from the polishing process.

In one embodiment of the invention a protective layer is formed on the polished surface of at least one of the first and second wafers.

Advantageously, the peripheral recess is formed to extend completely around the first wafer.

In one embodiment of the invention the material of the first wafer is silicon, and the material of the second wafer may also be silicon.

In one embodiment of the invention the first wafer is machined to a desired thickness after the laminate of the first and second wafers has been formed, the desired thickness being not greater than the depth to which the peripheral recess is etched into the first wafer from the first major surface thereof.

In another embodiment of the invention the second wafer is provided to form a handle layer of the composite wafer, and the first wafer is provided to form a device layer of the composite wafer in which devices are formed subsequent to the forming of the laminate of the first and second wafers.

In one embodiment of the invention the devices are micro-mechanical devices.

In another embodiment of the invention the devices are electronic devices, and typically may be electronic semiconductor devices, and in a still further embodiment of the invention the devices may be a combination of micro-mechanical devices and electronic devices.

Additionally the invention provides a composite semiconductor wafer in the form of a laminate comprising:

a first wafer of semiconductor material having a first major surface, and a second wafer of semiconductor material having a first major surface, the first major surface of the second wafer facing in a direction towards the first major surface of the first wafer.

wherein at least a portion of the periphery of the first wafer is defined by a peripheral recess, which had been formed in the first wafer through the first major surface adjacent a peripheral edge thereof prior to the laminate of the first and second wafers being formed, so that any surface imperfection on the first major surfaces of the first and second wafers in the area corresponding to the area where the peripheral recess had been formed does not interfere with the formation of the laminate of the first and second wafers.

In one embodiment of the invention the thickness to which the first wafer is finished after the formation of the laminate of the first and second wafers does not exceed the depth to which the peripheral recess had been formed into the first wafer through the first major surface thereof so that at least a portion of the periphery of the finished first wafer is defined by the peripheral recess.

In another embodiment of the invention at least one buried layer is located between the first major surfaces of the first and second wafers. Preferably, the buried layer is an oxide layer.

In another embodiment of the invention the area of the buried layer is similar to the area of the first major surface of the first wafer defined by the peripheral recess so that the peripheral edge of the first wafer defined by the peripheral recess and the adjacent peripheral edge of the buried layer coincide.

In a further embodiment of the invention the semiconductor material of at least one of the first and second wafers is silicon.

In one embodiment of the invention a component is formed in one of the first and second wafers.

In another embodiment of the invention the component is a micro-mechanical component.

In a further embodiment of the invention the component is an electronic device.

ADVANTAGES OF THE INVENTION

The advantages of the invention are many. The provision of the peripheral recess extending into the first major surface of the first wafer around the periphery thereof, either removes surface imperfections around the periphery of the first major surface if such surface imperfections were present on the first major surface of the first wafer, and/or provides clearance for any surface imperfections in the corresponding peripheral area of the first major surface of the second wafer. Accordingly, with the surface imperfections removed around the periphery of the first major surface of the first wafer and clearance being provided for surface imperfections around the first major surface of the second wafer, the composite wafer can be formed with the first and second wafers without leaving an unbonded portion extending around the periphery of the composite wafer. Thus, where the first major surfaces of the first and second wafers are to be bonded directly to each other, the remaining portion of the first major surface of the first wafer defined by the peripheral recess is bonded directly to the corresponding area of the first major surface of the second wafer, and the two first major surfaces are bonded together over their entire area without any unbonded peripheral portions, provided of course no other surface imperfections are present on the first major surfaces of the first and second wafers. On the other hand, where a buried layer is to be located between the first major surfaces of the first and second wafers, the buried layer may be formed on one or both of the first major surfaces. In either case, the absence of surface imperfections on the first major surface of the first wafer and/or the provision of clearance for the surface imperfections on the first major surface of the second wafer, resulting from the peripheral recess, facilitates bonding of the first major surface of the one of the first and second wafers to the buried oxide layer, or bonding of the two oxide layers over the entire interface surfaces without any unbonded peripheral areas. The formation of the peripheral recess removes the peripheral portion of the first wafer which would otherwise have remained unbonded to the second wafer, or where the buried layer or a portion thereof is formed on the first major surface of the first wafer, the portion of the buried layer which would otherwise have remained unbonded to the second wafer or a buried layer thereon does not exist, due to the presence of the peripheral recess in the first wafer.

Another advantage of the invention is that once the first and second wafers have been bonded either directly together or with a buried layer therebetween, as the case may be, to form the composite wafer, no further etching, grinding or otherwise treating or machining the first wafer to remove an unbonded peripheral portion is required as is the case in prior art methods. Thus, there is no danger of damage to the first or second wafers or to the buried layer, which would otherwise arise using prior art methods in the removal of the unbonded peripheral portion, since the composite wafer is formed by the method according to the invention without any unbonded peripheral portions.

By forming the peripheral recess to a depth from the first major surface of the first wafer, which is at least equal to the thickness to which the first wafer is to be finished after the composite wafer is formed, the peripheral recess defines the periphery of the first wafer when the thickness of the first wafer has been reduced to its finished thickness, and no further etching or machining of the first wafer is required in order to define its periphery. Additionally, when the peripheral recess is formed to a depth equal to or just greater than the finished thickness to which the first wafer is to be finished, the etch time for etching the peripheral recess is optimised where the peripheral recess is formed by etching, and the machining time is optimised where the peripheral recess is to be formed by machining.

A particularly important advantage of the invention is that the method according to the invention is suitable for use with composite wafers having device and handle wafers forming device and handle layers of any desired thicknesses and ratio of thickness. There is no limit to the thickness ratio of the handle layer to the device layer, nor is there any limit of the ratio of the thickness of the handle wafer and the device wafer to the thickness of material ground from the device wafer, as is the case where the peripheral edge of the device wafer is subsequently ground after bonding of the device and handle wafers together in order to remove the unbonded peripheral portion of the device wafer. Since the peripheral imperfections are removed from the device wafer, and/or clearance is provided for peripheral imperfections on the handle wafer, prior to bonding of the device and handle wafers together, the ratio of the thickness of the handle wafer to the device wafer is irrelevant, as is the ratio of the thickness of the handle and device wafers to the thickness of material ground from the device wafer. However, it is desirable that the peripheral recess should be formed to a depth at least equal to and preferably greater than the final finished thickness of the device layer, so that when the device lay is ground to its final finished thickness, the peripheral surface defined by the peripheral recess forms the peripheral edge of the device layer. This, thus, avoids any need for subsequent removal of the peripheral edge of the first wafer which would otherwise overhang the peripheral recess.

The invention and its advantages will be more clearly understood from the following description of some preferred embodiments thereof, which are given by way of example only, with reference to the accompanying drawings, which are not to scale, and are provided for illustrative purposes only.

DETAILED DESCRIPTION OF THE INVENTION

Figure 1:
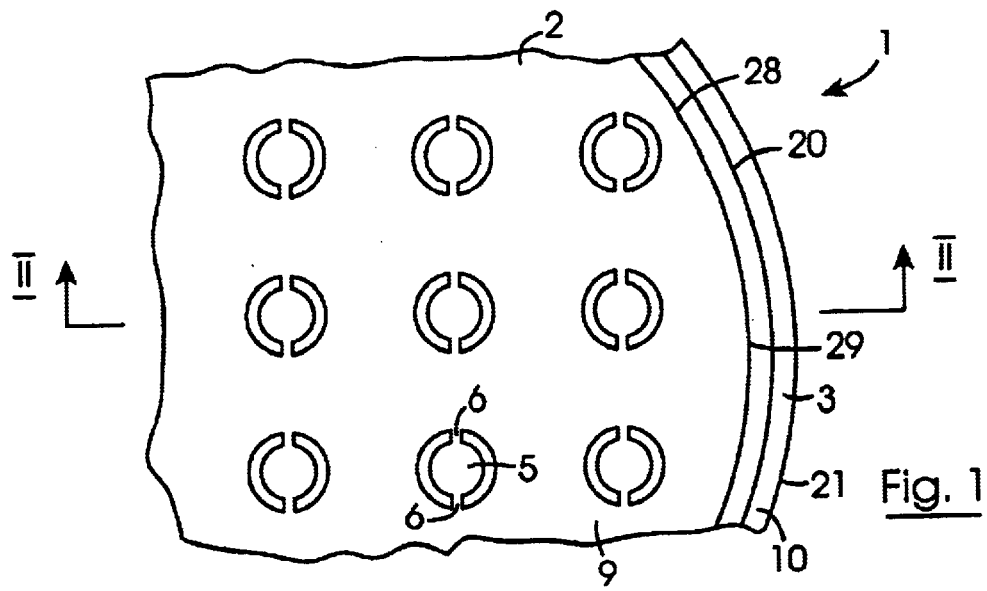
FIG. 1 is a top plan view of a portion of a composite semiconductor wafer according to the invention.
Figure 2:
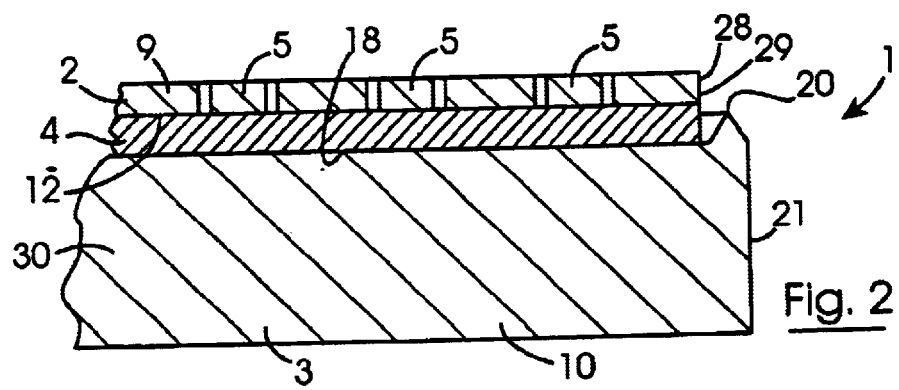
FIG. 2 is a transverse cross-sectional side elevational view of the composite wafer of FIG. 1 on the line II—II of FIG. 1.
Figure 3:
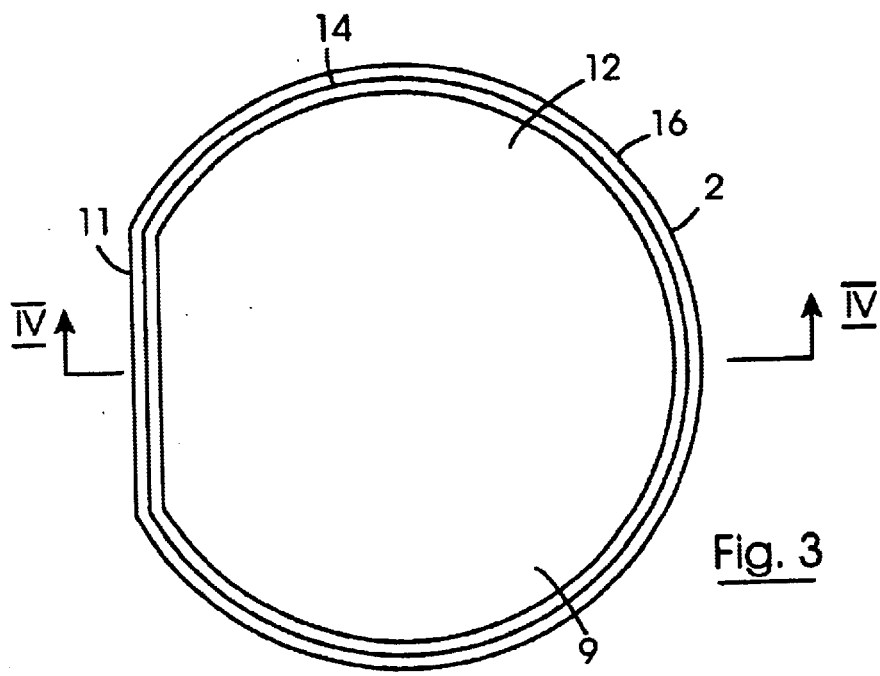
FIG. 3 is a top plan view of a wafer for use in the composite wafer of FIG. 1.
Figure 4:
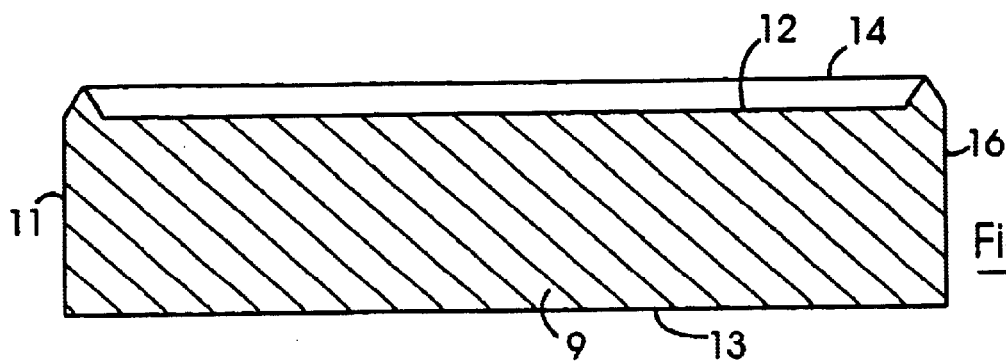
FIG. 4 is a transverse cross-sectional side elevational view of the wafer of FIG. 3 on the line IV—IV of FIG. 3.
Figure 5:
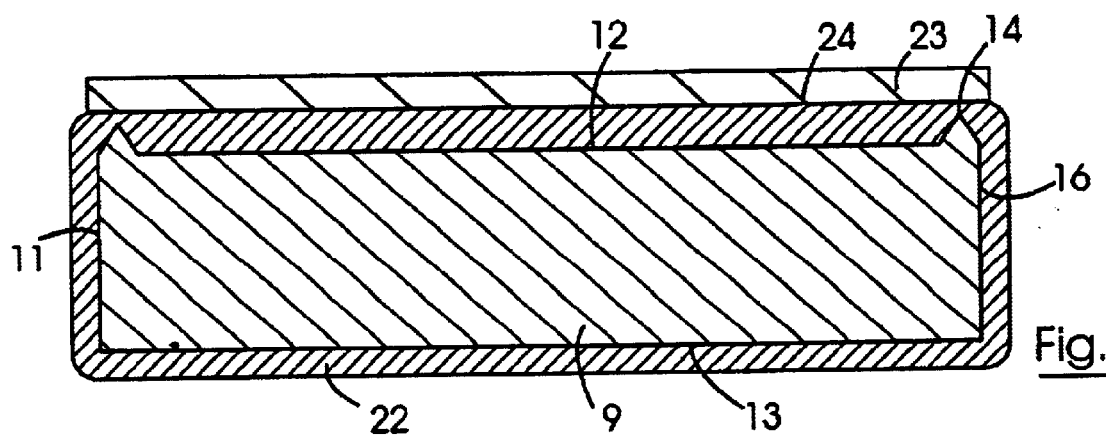
FIG. 5 is a view similar to FIG. 4 of the wafer of FIG. 3 being prepared using a method according to the invention for preparing the composite wafer of FIG. 1.

Referring to the drawings, which are not to scale, and initially to FIGS. 1 and 2, there is illustrated a composite semiconductor wafer according to the invention, indicated generally by the reference numeral 1. formed by a method according to the invention. The composite wafer 1 is an SOI (silicon on insulator) and comprises a device layer 2 supported on a handle layer 3 with a buried oxide layer 4 located between the device and handle layer 2 and 3, respectively. A plurality of micro-mechanical components, in this embodiment of the invention micro-mirrors 5 are formed in the device layer 2 and are tiltably connected to the device layer 2 by tethers 6. Bores (not shown) would typically be etched through the handle layer 3 and the buried oxide layer 4 for accommodating electrodes to the micro-mirrors 5 for tilting thereof. The arrangement and formation of such bores and micro-mirrors in a device layer of a composite wafer will be well known to those skilled in the art.

Referring now to FIGS. 3 to 11, the device layer 2 is formed from a first wafer, namely, a device wafer 9 of single crystal silicon, and the handle layer 3 is formed from a second wafer, namely, a handle wafer 10 also of single crystal silicon. The device wafer 9 is selected to be of the desired shape and size, which typically is of substantially circular shape, and may be of diameter, typically, in the range of 100 mm to 150 mm, and of thickness, typically, in the range of 300 $\mu$m to 800 $\mu$m. The device wafer 9 typically is provided with an alignment edge 11. The device wafer 9 comprises a first major surface 12 and an opposite second major surface 13. In this embodiment of the invention the first major surface 12 is a polished surface, and a peripheral ridge 14 resulting from the polishing process extends from the first major surface 12 around the device wafer 9 adjacent a peripheral edge 16 thereof. The handle wafer 10 is also selected to be of the desired shape and size, which typically is also of substantially circular shape, and typically of diameter in the range of 100 mm to 150 mm, but similar to the diameter of the device wafer 9. The handle wafer 10 is of thickness typically in the range of 300 $\mu$m to 800 $\mu$m, and is also provided with an alignment edge 17 for aligning with the alignment edge 11 of the device wafer 9, for in turn, aligning the device wafer 9 and the handle wafer 10 together. The handle wafer 10 comprises a first major surface 18 and a second major surface 19, and in this embodiment of the invention the first major surface 18 is polished with a resulting peripheral ridge 20 extending from the first major surface 18 around the handle wafer 10 adjacent a peripheral edge 21 thereof, which is similar to the peripheral ridge 14 on the first major surface 12 of the device wafer 9. The buried oxide layer 4 may be of any desired thickness, and will depend on the degree of electrical insulation required between the device and handle layers 2 and 3, and will also depend on the physical spacing required between the device and handle layers 2 and 3. Typically, the buried oxide layer 4 will be of thickness in the range of 0.2 $\mu$m to 4 $\mu$m.

In order to avoid the danger of an unbonded peripheral area being formed around the periphery of the composite wafer 1, the peripheral ridge 14 on the first major surface 12 of the device wafer 9 is removed and clearance is provided for the peripheral ridge 20 of the handle wafer 10 before laminating the device and handle wafers 9 and 10 into a laminate to form the composite wafer 1. This is achieved by forming a peripheral recess 25 into the device wafer 9 through the first major surface 12 extending completely around the peripheral edge 16 of the device wafer 9, as will be described below.

Initially, an oxide layer 22, a portion of which subsequently forms the buried oxide layer 4, is thermally grown all over the device wafer 9, in other words, all over the first and second major surfaces 12 and 13, and the peripheral edge 16. The depth to which the oxide layer 22 is grown depends on the required thickness of the buried the layer 4, and the oxide layer 22 is grown on the first major surface 12 to the required thickness of the buried oxide layer 4. On completion of the growing of the oxide layer 22, a photoresist layer 23 is deposited on a first major surface 24 of the oxide layer 22 which corresponds with the first major surface 12 of the device wafer 9. The photoresist layer 23 and oxide layer 22 are then patterned for etching the peripheral recess 25 into the device wafer 9 through the first major surface 12 and extending around the peripheral edge 16 for removing the peripheral ridge 14 and for providing clearance for the peripheral ridge 20 extending around the first major surface 18 of the handle wafer 10.

Figure 6:
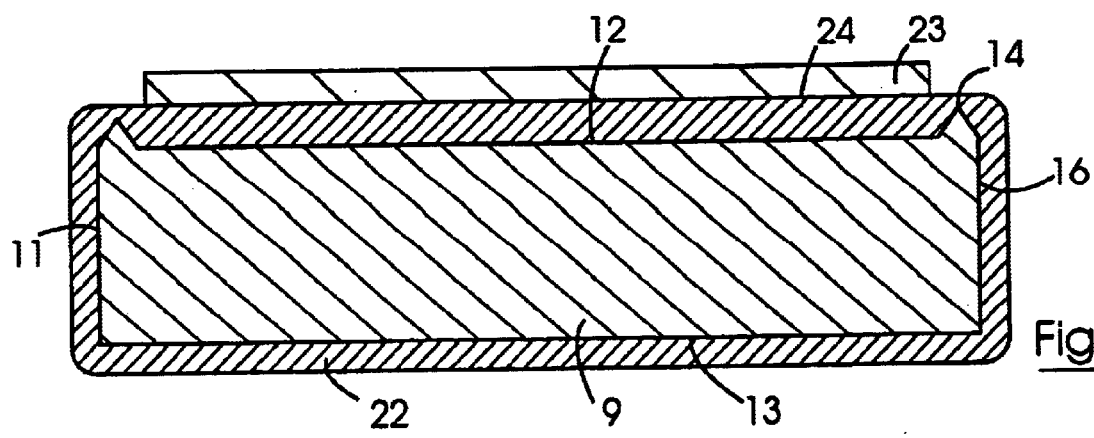
FIG. 6 is a view similar to FIG. 4 of the wafer of FIG. 3 at another stage of the method according to the invention.
Figure 7:
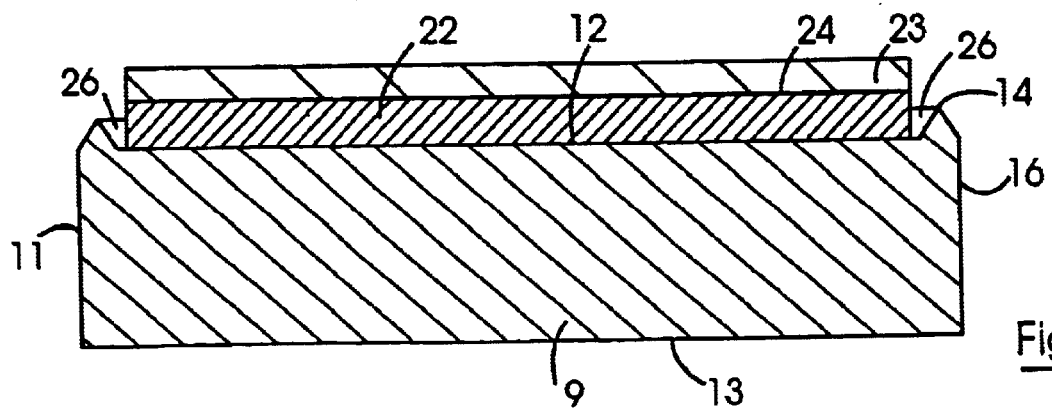
FIG. 7 is a view similar to FIG. 4 of the wafer of FIG. 3 at a further stage of the method according to the invention.
Figure 8:
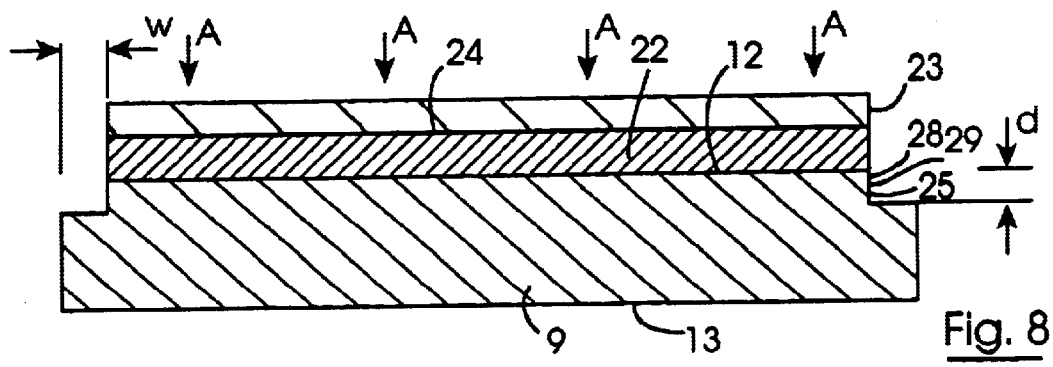
FIG. 8 is a view similar to FIG. 4 of the wafer of FIG. 3 at a still further stage of the method according to the invention.
Figure 9:
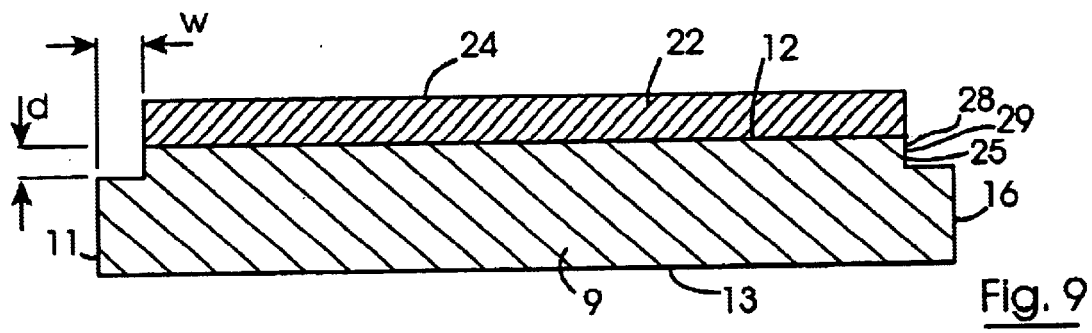
FIG. 9 is a view similar to FIG. 4 of the wafer of FIG. 3 at a further stage of the method according to the invention.
Figure 10:
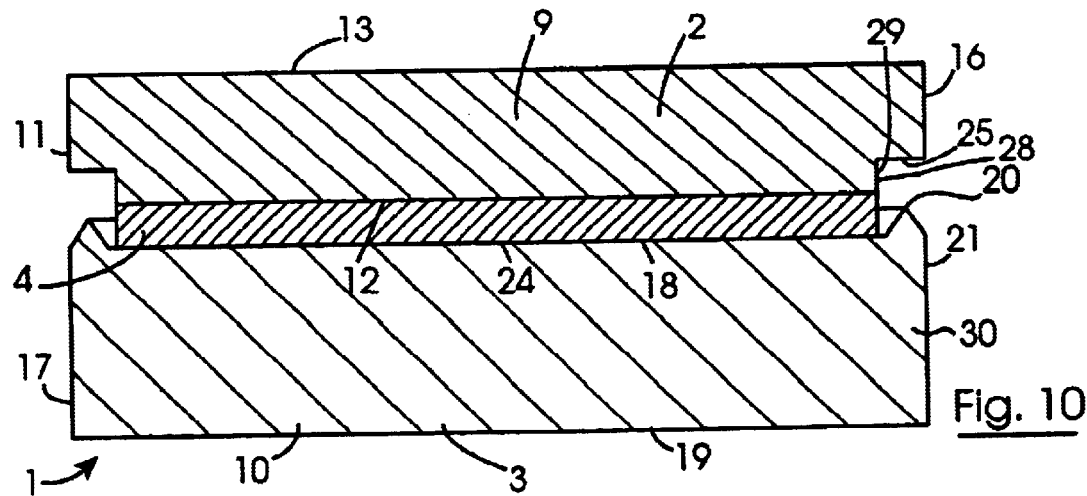
FIG. 10 is a transverse cross-sectional side elevational view of the composite wafer of FIG. 1 being prepared using the method according to the invention with the wafer of FIG. 3 fusion banded to another wafer.
Figure 11:
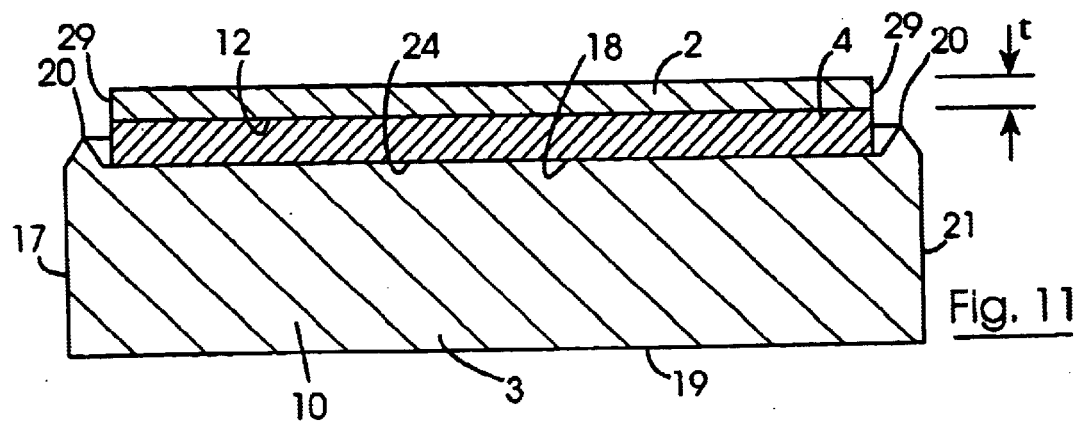
FIG. 11 is a transverse cross-sectional side elevational view of the composite wafer of FIG. 1 prior to the formation of micro-mechanical components in the composite wafer.
Figure 12:
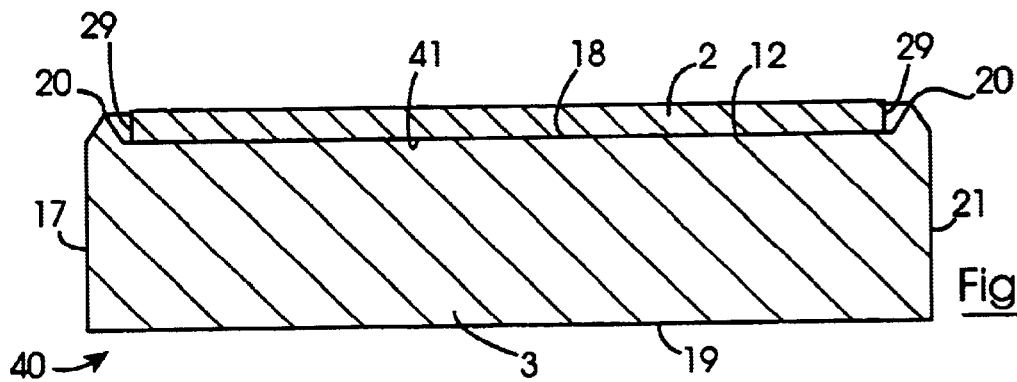
FIG. 12 is a view similar to FIG. 11 of a composite wafer according to another embodiment of the invention, FIG, 13 is a view similar to FIGS. 6 of a wafer being prepared for the composite wafer of FIG. 12.
Figure 13:
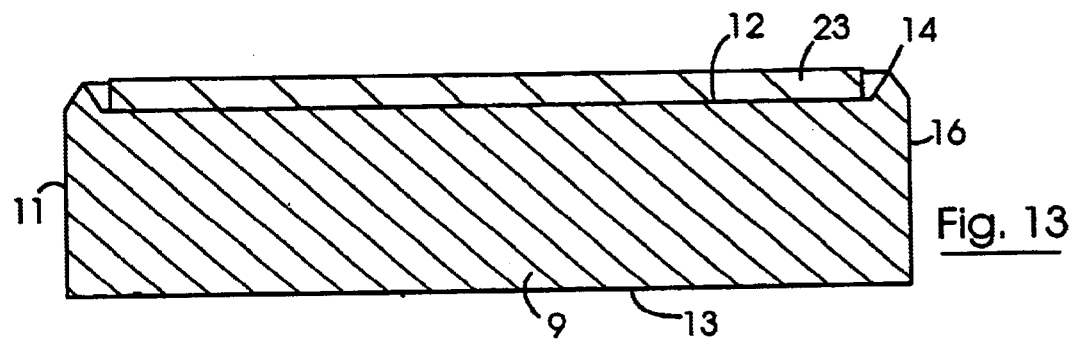
Figure 14:
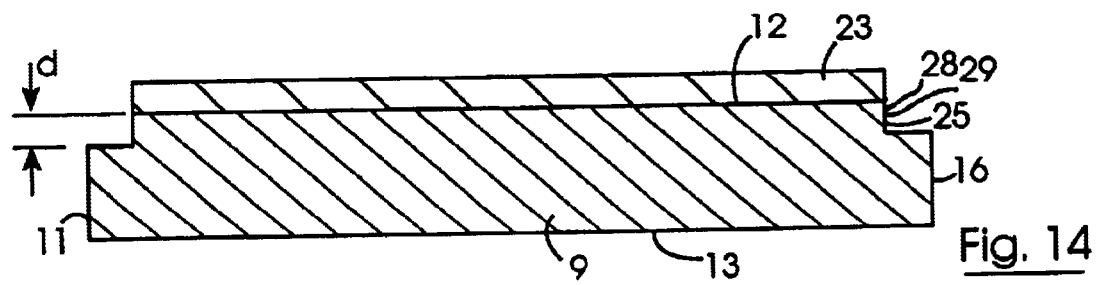
FIG. 14 is a view similar to FIG. 8 of the wafer of FIG, 13 being prepared for the composite wafer of FIG. 12.
Figure 15:
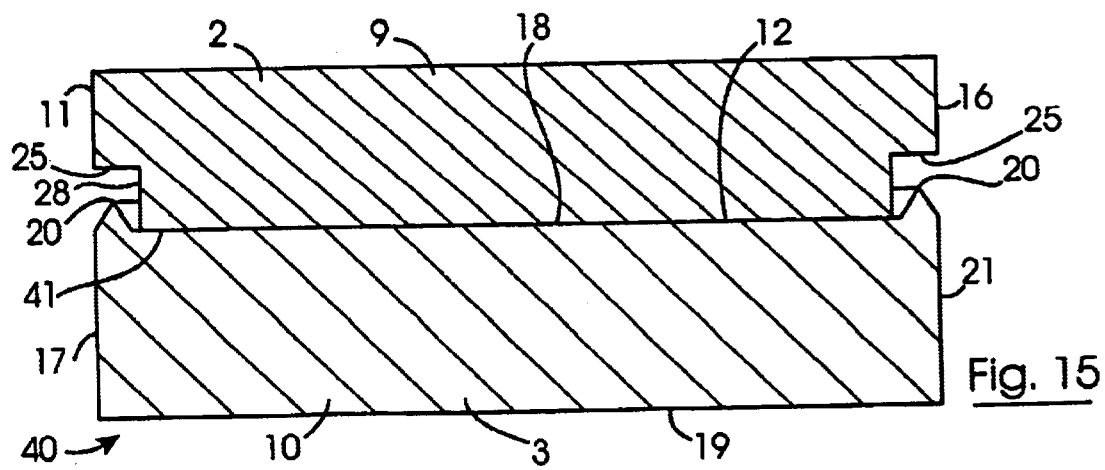
FIG. 15 is a view similar to FIG. 10 of the composite wafer of FIG. 12 being prepared.

With the photoresist layer 23 appropriately patterned to define the peripheral recess 25 as illustrated in FIG. 6, the device wafer 9 is subjected to a buffered hydrofluoric acid (BHF) etch for removing the oxide layer 22 with the exception of the portion of the oxide layer 22 under the patterned photoresist layer 23 which is ultimately to form the buried oxide layer 4. The hydrofluoric acid is buffered at a concentration of 7:1 in water for the BHF etch. Alternatively, the oxide layer 22 may be etched by a reactive ion etch (RIE) using a trifluoromethane/tetrafluoromethane plasma. The removal of the oxide layer 22 exposes a peripheral portion 26 of the first major surface 12 where the peripheral recess 25 is to be formed. The device wafer 9 is then subjected to an inductively coupled plasma (ICP) etch using a Bosch process comprising alternate etching with sulphur hexafluoride and passivation with octafluorocyclobutane. The inductively coupled plasma etch is directed in the direction of the arrows A, see FIG. 8, towards the patterned photoresist layer 23 and the exposed peripheral portion 26 of the first major surface 12 for etching the peripheral recess 25. The ICP etch is continued until the peripheral recess 25 has been etched into the device wafer 9 through the first major surface 12 to a depth d. The depth d to which the peripheral recess 26 is etched is determined by the final thickness t to which the device wafer 9 is machined in order to form the device layer 2. In other words, the final thickness t is the thickness to which the device layer 2 is machined prior to forming the micro-mirrors 5 therein. The depth d to which the peripheral recess 25 is etched should be at least equal to or greater than the final thickness t to which the device wafer 9 is to be machined to form the device layer 2, so that when machined to the thickness t a peripheral surface 28 defined by the peripheral recess 25 defines the peripheral edge 29 of the finished device layer 2, see FIGS. 2 and 11. The radial width w of the peripheral recess 25 is selected to be such as to ensure removal of the peripheral ridge 14 and to provide adequate clearance for the peripheral ridge 20 on the first major surface 18 of the handle wafer 10.

On completion of the ICP etch the photoresist layer 23 is removed, thus exposing the remaining portion of the oxide layer 22 which is to form the buried oxide layer 4. The device wafer 9 is then ready for high temperature anneal bonding to the handle wafer 10. The oxide layer 22 is brought into engagement with the first major surface 18 of the handle wafer 10 with the alignment edges 11 and 17 of the device and handle wafers 9 and 10 aligned with each other and the peripheral edges 16 and 21 of the device and handle wafers 9 and 10, respectively, also aligned, see FIG. 10. The device and handle wafers 9 and 10 are then placed in an anneal chamber, and subjected to a high temperature annealing with the temperature in the range of 1,000° C. to 1.200° C. for a time period in the range of 30 minutes to 180 minutes for fusion bonding of the oxide layer 22 to the first major surface 18 of the handle wafer 10 to form a laminate 30 of the device and handle wafers 9 and 10 with the buried oxide layer 4 located therebetween, and thus forming the composite wafer 1.

Thereafter the device wafer 9 is machined to the desired thickness t by grinding and chemical mechanical polishing, thereby forming the device layer 2. Typically, the device wafer 9 is ground to a thickness t in the range 2 $\mu$m to 200 $\mu$m to form the device layer 2. Once the device wafer 9 has been ground to the desired thickness t to form the device layer 2, the peripheral surface 28 formed by the peripheral recess 25 now forms the peripheral edge 29 of the device layer 2 and the buried oxide layer 4. Thereafter the micro-mirrors 5 are formed in the device layer 2 by depositing a photoresist layer (not shown) on the exposed machined second major surface 13 of the device layer 2 for defining the micro-mirrors 5 and the tethers 6. The photoresist layer (not shown) is then patterned and the micro-mirrors 5 and the tethers 6 are etched in conventional fashion. Thereafter further processing of the composite wafer 1 will be well known to those skilled in the art.

Referring now to FIGS. 12 to 15, there is illustrated a composite semiconductor wafer 40 according to another embodiment of the invention. The composite wafer 40 is substantially similar to the composite wafer 1, and similar components are identified by the same reference numerals. The main difference between the composite wafer 40 and the composite wafer 1 is that the buried oxide layer 4 has been omitted, and the device and handle wafers 9 and 10 are bonded together at a silicon/silicon interface 41. The device and handle wafers 9 and 10 are similar to the device and handle wafer 9 and 10 of the composite wafer 1. In this embodiment of the invention since a buried oxide layer is not required, the photoresist layer 23 for defining the peripheral recess 26 is deposited directly onto the first major surface 12 of the device wafer 9. After patterning the photoresist layer 23 to define the peripheral recess 25, see FIG. 13, the device wafer 9 is subjected to the ICP etch in similar fashion as described with reference to the composite wafer 1. The peripheral recess 25 is etched to the desired depth d and the photoresist layer 23 is then removed. The device and handle wafers 9 and 10 are then brought into engagement with their respective first major surfaces 12 and 18 abutting each other and with the alignment edges 11 and 17 and the peripheral edges 16 and 21 aligned with each other, and are placed in an anneal chamber, and subjected to a high temperature annealing for fusion bonding thereof. The device wafer 9 is then machined to the desired thickness t as already described with reference to the composite wafer 1 so that the peripheral surface 28 of the peripheral recess 25 defines the peripheral edge 29 of the device layer 2. The composite wafer 40 is then subjected to further machining and processing as desired.

While the buried oxide layer 4 of the composite wafer 1 has been described as being formed from the oxide layer 22, it is envisaged in certain cases that after etching of the peripheral recess 26 in the device wafer 9 the remaining portion of the oxide layer 22 beneath the photoresist layer 23 may be removed, and an oxide layer to form the buried oxide layer could then be grown or deposited on one or both the first major surfaces 12 and 18 of the device and handle wafers 9 and 10 respectively. If the oxide layer is formed on the device wafer 9, the handle layer 10 would then be bonded to the oxide layer on the device wafer 9 by suitable bonding, for example, high temperature anneal bonding. Alternatively, if the oxide layer is formed on the handle wafer 10, then the first major surface 12 of the device wafer 9 would be bonded to the oxide layer. Alternatively, if oxide layers are grown or deposited on both the first major surfaces 12 and 18 of both the device and handle wafers 9 and 10, respectively, the device and handle wafers 9 and 10 would be bonded together by bonding the two oxide layers together to form the buried oxide layer. Additionally, if it were desired to form the oxide layer on the first major surface of the second wafer, it will be readily apparent to those skilled in the art that the first major surface of the first wafer could be patterned with a photoresist layer only, and the oxide layer 22 could be omitted.

In the preparation of the device wafer 9 of the composite wafer 40 for forming the peripheral recess 25, it is also envisaged that prior to depositing the photoresist layer 23 on the device wafer 9, an oxide layer similar to the oxide layer 22 may be grown on the device wafer 9 in similar fashion as described with reference to the device wafer 9 of the composite wafer 1. In which case, the photoresist layer would be deposited on the oxide layer and appropriately patterned as already described. The oxide layer would then be etched by a suitable wet etch, for example, a buffered hydrofluoric acid etch or a reactive ion etch using a trifluoromethane/tetrafluoromethane plasma, thus leaving the portion of the oxide layer beneath the photoresist layer 23. The device wafer 9 would then be subjected to a silicon etch, for example, the ICP etch for etching the peripheral recess 25. On completion of the etching of the peripheral recess 26, the photoresist layer and the remainder of the oxide layer beneath the photoresist layer would be removed.

While the composite wafers have been described as being prepared for use as composite wafers in which a plurality of micro-mirrors are subsequently formed in the device layer, it will be appreciated that the composite wafers may be prepared for any other use, whereby other type of devices may be formed. For example, other types of micro-mechanical components may be subsequently formed in the device layer. Additionally, the composite wafers may be prepared to be suitable for the formation of electronic devices, for example, electronic semiconductor devices, and/or circuits in the device layer, and furthermore, it will be appreciated that the composite wafers may be prepared to be suitable for use as composite wafers in which both micro-mechanical components and electronic devices and circuitry may be subsequently formed in the device layer. Additionally, while the composite wafers have been described as being formed to be suitable for the subsequent formation of a particular type of micro-mirror in the device layer, where micro-mirrors are to be formed in the device layer, it will be appreciated that any type of micro-mirrors may be formed in the device layer. In general, it is envisaged that the thickness t to which the device layer is machined will be dependent on the use to which be composite wafer is to be put subsequently. Needless to say, the composite wafer may be put to any other desired or suitable use.

While the device and handle wafers which have been used in the preparation of the composite wafers have each been described as having polished first major surfaces with respective peripheral ridges extending around the first major surfaces resulting from the polishing process, it will be readily apparent to those skilled in the art that the method for preparing the composite wafer is equally suitable whether one or both of the device and handle wafers are provided with a peripheral ridge extending from their respective first major surfaces around the peripheral edge thereof. For example, where the device wafer is provided with a peripheral ridge extending from its first major surface around the peripheral edge thereof, and the handle water is provided without such a peripheral ridge, the peripheral recess removes the peripheral ridge from the device wafer. However, on the other hand, where the device wafer is provided without a peripheral ridge extending from its first major surface, and only the handle wafer in provided with a peripheral ridge extending from its first major surface around the peripheral edge thereof, the formation of the peripheral recess in the device wafer provides clearance for the peripheral ridge extending from the first major surface around the peripheral edge of the handle wafer, and thereby the peripheral ridge on the handle wafer does not inhibit laminating of the device and handle wafers together, irrespective of whether the device and handle wafers are directly bonded or are bonded with a buried layer be it oxide or otherwise therebetween. It will also of course be appreciated that the method for forming the composite wafer according to the invention is equally useful where either or both the device and handle wafers are provided with other surface imperfections on their respective first major surfaces adjacent the peripheral edges thereof, which would otherwise inhibit laminating of the device and handle wafers adjacent their peripheral edges thereof irrespective of whether the device and handle wafers are being bonded directly together or with a buried layer located therebetween. Such surface imperfections may be one or more projections extending from the first major surface of one or both of the device and handle wafers adjacent the peripheral edges thereof, or may be one or more recesses extending into the first major surface of one or both of the device and handle wafers, adjacent the peripheral edges thereof, or may be a combination of projections and recesses, all of which would inhibit bonding around the peripheral edges of the device and handle wafers.

While the device and handle wafers have been selected from wafers of sizes and dimensions within specific ranges, the device and handle wafers may be selected from wafers supplied to any other suitable size or thickness. While the device and handle wafers have been described as being of substantially circular shape, the device and handle wafers may be selected from wafers of any other suitable shape. Needless to say, while the device and handle wafers have been described as being of single crystal silicon the wafers may be of any other suitable silicon-based material. Additionally, the device and handle wafers may be of any other suitable semiconductor material.

It will also he appreciated that the device layer and handle layer may be machined to any other desired thicknesses for forming the device and handle layer besides those described. However, typically, the device layer will be machined to a thickness within the range of 2 $\mu$m to 200 $\mu$m. The thickness to which the device layer will be machined as discussed above will, in general, be dependent on the use to which the composite wafer is to be put subsequently. and in particular, to the components to be subsequently formed in the device layer. In general, where the components to be formed in the device layer are micro-mirrors, it is envisaged that the thickness to which the device layer will be machined will be in the range of 3 $\mu$m to 50 $\mu$m and more commonly in the range of 3 $\mu$m to 10 $\mu$m. For other purposes the device layer may be machined to a thickness of up to 200 $\mu$m. However, needless to say, the composite wafer may be supplied with the device layer of any suitable thickness which could then be subsequently machined prior to the formation of the components or devices therein. It will be readily apparent to those skilled in the art that prior to or subsequent to laminating the device and handle wafers, the handle layer could be machined to a thickness, which would be the final desired thickness, or such machining, if desired, could be carried out after the micro-mechanical components or electronic semiconductor devices have been formed in the device layer. The handle wafer may be machined to any appropriate suitable depth.

While the buried oxide layer has been described as being of thickness in the range of 0.2 μm to 4 μm, the buried oxide layer may be of any desired thickness, and will largely be determines on the degree of electrical insulation desired between the device layer and the handle layer, and also will be determined by the physical spacing required between the device layer and the handle layer.

While the buried layer between the first major surfaces of the device and handle layer has been described as being a buried oxide layer. It will be readily apparent to those skilled in the art that one or more buried layers of any suitable material may be provided between the first major surfaces of the device and handle layers.

While specific oxide etches and silicon etches have been described, any suitable etch may be used for removing portions of the oxide layer grown on the device wafer prior to forming the peripheral recess. Needless to say, other suitable wet or dry silicon etches besides an ICP etch may be used for etching the peripheral recess, for example, a potassium hydroxide etch, a tetramethyl ammonium hydroxide etch, a hydrofluoric acid/nitric acid etch, or a hydrofluoric acid/nitric acid/acetic acid etch, or an RIE etch.

While the oxide layers have been described as being thermally grown oxide layers, any other suitable grown oxide layers may be used, and it is also envisaged that instead of growing the oxide layer or layers, the oxide layer or layers may be deposited by any suitable chemical vapour deposition process.

While masking layers provided by photoresist and oxide layers have been described, any other suitable materials may be used in the formation of masking layers, for example, silicon nitride or the like.

While the peripheral recess has been described as being defined by a photoresist layer, any other suitable means for defining the peripheral recess may be used, for example, masking tape or a clamped plate.

While the method for forming the peripheral recess has been described as being an etching method, any other suitable method for forming the peripheral recess may be used, for example, the peripheral recess may be formed by mechanical machining or other such mechanical processes.

While the peripheral recess has been described as being formed in the device wafer, the peripheral recess may, if desired, be formed in the handle wafer, and it is also envisaged that in certain cases, peripheral recesses may be formed in both the device wafer and in the handle wafer. Where the peripheral recess is formed in the handle wafer, it is desirable that it should be formed to a depth equal to or greater than the final thickness to which the handle wafer is to be finished in order to avoid overhang of portions of the handle wafer over the peripheral recess after the handle wafer has been finished to its final thickness.

It is also envisaged that where the peripheral recess is to be formed by machining, a protective layer may be formed over the surface of the first and/or second wafer into which the peripheral recess is to be formed, in order to protect the surface, particularly if the surface into which the peripheral recess is to be formed is a polished surface. The protective layer may be an oxide layer, a photoresist layer, a silicon nitride layer, or the like.

What is claimed is:

1. A method for forming a composite semiconductor wafer in the form of a laminate from first and second wafers of semiconductor material, the method comprising the step of forming a peripheral recess in a first major surface of the first wafer adjacent a peripheral edge thereof corresponding to respective peripheral areas of the first major surfaces of the first and second wafers where a surface imperfection may occur go that the surface imperfection does not interfere with the formation of the laminate of the first and second wafers with the first major surface of the respective first and second wafers facing in directions towards each other.

2. A method as claimed in claim 1 in which the peripheral recess is formed into the first wafer to a depth from the first major surface which is at least equal to the thickness to which the first wafer is to be subsequently finished after the laminate of the first and second wafers has been formed so that at least a portion of the periphery of the finished first wafer is defined by the peripheral recess.

3. A method as claimed in claim 2 in which the peripheral recess is formed into the first wafer to a depth from the first major surface which is greater than the thickness to which the first wafer is to be subsequently finished after the formation of the laminate of the first and second wafers.

4. A method as claimed in claim 1 in which at least one layer of material is formed on the first major surface of at least one of the first and second wafers to form a buried layer between the first major surfaces of the first and second wafers when the laminate of the first and second wafers has been formed.

5. A method as claimed in claim 4 in which each layer which is to form the buried layer is an oxide layer.

6. A method as claimed in claim 4 in which each layer which is to form the buried layer is a grown layer.

7. A method as claimed in claim 4 in which each layer which is to form the buried layer is a deposited layer.

8. A method as claimed in claim 4 in which the layer which is to form the buried layer is formed on the first wafer.

9. A method as claimed in claim 4 in which the layer which is to form the buried layer is formed on the second wafer.

10. A method as claimed in claim 4 in which the layer which is to form the buried layer is formed on the first wafer subsequent to the formation of the peripheral recess.

11. A method as claimed in claim 4 in which the layer which is to form the buried layer is formed on the first wafer prior to the formation of the peripheral recess, and the peripheral recess is formed through the said layer.

12. A method an claimed in claim 1 in which the peripheral recess is formed by etching the first wafer through the first major surface thereof.

13. A method as claimed in claim 12 in which the peripheral recess is formed by wet etching.

14. A method as claimed in claim 12 in which the peripheral recess is formed by dry etching.

15. A method as claimed in claim 12 in which the peripheral recess is etched through a patterned layer formed on the first major surface defining the peripheral recess.

16. A method as claimed in claim 1 in which the peripheral recess is formed by machining.

17. A method as claimed in claim 1 in which the surface imperfection is on the first major surface of the first wafer.

18. A method as claimed in claim 1 in which the surface imperfection comprises a ridge extending from and around the first major surface adjacent the peripheral edge thereof.

19. A method as claimed in claim 1 in which the first major surface of the first wafer is a polished surface, and the surface imperfection results from the polishing process.

20. A method as claimed in claim 1 in which the first major surface of the second wafer is a polished surface, and the surface imperfection results from the polishing process.

21. A method as claimed in claim 20 in which a protective layer is formed on the polished surface of at least one of the first and second wafers.

22. A method as claimed in claim 1 in which the peripheral recess is formed to extend completely around the first wafer.

23. A method as claimed in claim 1 in which the material of the first wafer is silicon.

24. A method as claimed in claim 1 in which the material of the second wafer is silicon.

25. A method as claimed in claim 1 in which the first wafer is machined to a desired thickness after the laminate of the first and second wafers has been formed, the desired thickness being not greater than the depth to which the peripheral recess is etched into the first wafer from the first major surface thereof.

26. A method as claimed in claim 1 in which the second wafer is provided to form a handle layer of the composite wafer, and the first wafer is provided to form a device layer of the composite wafer in which devices are formed subsequent to the forming of the laminate of the first and second wafers.

27. A method as claimed in claim 25 in which the devices are micro-mechanical devices.

28. A method as claimed in claim 25 in which the devices are electronic devices.

29. A composite semiconductor wafer in the form of a laminate comprising:
  a first wafer of semiconductor material having a first major surface, and
  a second wafer of semiconductor material having a first major surface, the first major surface of the second wafer facing in a direction towards the first major surface of the first wafer,
  wherein at least a portion of the periphery of the first wafer is defined by a peripheral recess, which had been formed in the first wafer through the first major surface adjacent a peripheral edge thereof prior to the laminate of the first and second wafers being formed, so that any surface imperfection on the first major surfaces of the first and second wafers in the area corresponding to the area where the peripheral recess had been formed does not interfere with the formation of the laminate of the first and second wafers.

30. A composite semiconductor wafer as claimed in claim 29 in which the thickness to which the first wafer is finished after the formation of the laminate of the first and second wafers does not exceed the depth to which the peripheral recess had been formed into the first wafer through the first major surface thereof so that at least a portion of the periphery of the finished first wafer is defined by the peripheral recess.

31. A composite semiconductor wafer as claimed in claim 29 in which at least one buried layer is located between the first major surfaces of the first and second wafers.

32. A composite semiconductor wafer as claimed in claim 31 in which the buried layer is an oxide layer.

33. A composite semiconductor wafer as claimed in claim 31 in which the area of the buried layer is similar to the area of the first major surface of the first wafer defined by the peripheral recess so that the peripheral edge of the first wafer defined by the peripheral recess and the adjacent peripheral edge of the buried layer coincide.

34. A composite semiconductor wafer as claimed in claim 29 in which the semiconductor material of at least one of the first and second wafers is silicon.

35. A composite semiconductor wafer as claimed in claim 29 in which a component is formed in one of the first and second wafers.

36. A composite semiconductor wafer as claimed in claim 35 in which the component is a micro-mechanical component.

37. A composite semiconductor wafer as claimed in claim 35 in which the component is an electronic device.

* * * * *

UNITED STATES PATENT AND TRADEMARK OFFICE
CERTIFICATE OF CORRECTION

PATENT NO. : 6,841,848 B2
APPLICATION NO. : 10/456177
DATED : January 11, 2005
INVENTOR(S) : MacNamara et al.

It is certified that error appears in the above-identified patent and that said Letters Patent is hereby corrected as shown below:

On the Cover Page in the Abstract:

At line 11, delete "pardon" and replace with --portion--
At line 12, insert the letter --d-- after the word "depth"
At line 13, delete "then" and replace with --than--
At line 14, delete "water" and replace with --wafer--

At Column 1, line 42, delete "an" and replace with --on--

At Column 1, line 62, delete "water and the buried layer, or between the burled layers, as" and replace with --wafer and the buried layer, or between the buried layers, as--

At Column 1, line 64, delete "areas" and replace with --area--

At Column 2, line 2, delete "an" and replace with --on--

At Column 2, line 20, delete "wafer" and insert --wafers--

At Column 2, line 21, delete "wafer with the oxide layer located between the wafers. There" and replace with --wafers with the oxide layer located between the wafers. There--

At Column 3, line 51, delete "waters" and replace with --wafers--

At Column 3, line 64, delete "or" and replace with --after--

At column 4, line 17, delete "water" and replace with --wafer--

At Column 6, line 61, delete "thickness." and replace with --thicknesses.--

At Column 7, line 12, delete "lay" and replace with --layers--

At Column 7, line 51, delete "banded" and replace with --bonded--

At Column 7, line 57, delete "FIGS. 6" and replace with --FIG. 6--

At Column 8, line 2, delete "1." and replace with --1,--

At Column 8, line 6, delete "layer" and replace with --layers--

UNITED STATES PATENT AND TRADEMARK OFFICE
CERTIFICATE OF CORRECTION

PATENT NO. : 6,841,848 B2
APPLICATION NO. : 10/456177
DATED : January 11, 2005
INVENTOR(S) : MacNamara et al.

It is certified that error appears in the above-identified patent and that said Letters Patent is hereby corrected as shown below:

At Column 9, line 2, delete "depends on the required thickness of the buried the layer 4, " and replace with --depends on the required thickness of the buried oxide layer 4, --

At Column 9, line 65, delete "1,000°C." and replace with --1,000°C--

At Column 9, line 66, delete "1.200°C." and replace with --1,200°C--

At Column 10, line 32 delete "handle wafer 9" and replace with --handle wafers 9--

At Column 10, line 35, delete "26" and replace with --25--

At Column 10, line 57, delete "26" and replace with --25--

At Column 10, line 62, insert a comma after "10"

At 11, line 28, delete "26" and replace with --25--

At Column 11, line 52, delete "will be dependent on the use to which be composite wafer" and replace with --will be dependent on the use to which the composite wafer--

At Column 12, line 42, insert a comma after the word "silicon"

At Column 12, line 46 delete "he" and replace with --be--

At Column 12, line 48 delete "layer" and replace with --layers--

At Column 13, line 9, delete "determines" and replace with --determined--

At column 13, line 14, delete "layer" and replace with --layers--

At Column 13, line 15, delete "buried oxide layer. It will be readily apparent to those skilled" and replace with --buried oxide layer, it will be readily apparent to those skilled--

UNITED STATES PATENT AND TRADEMARK OFFICE
CERTIFICATE OF CORRECTION

PATENT NO. : 6,841,848 B2
APPLICATION NO. : 10/456177
DATED : January 11, 2005
INVENTOR(S) : MacNamara et al.

It is certified that error appears in the above-identified patent and that said Letters Patent is hereby corrected as shown below:

At Column 14, line 11, delete "surface" and replace with --surfaces--

Signed and Sealed this

Twelfth Day of December, 2006

JON W. DUDAS
*Director of the United States Patent and Trademark Office*